US007897523B2

(12) United States Patent
Shibagaki et al.

(10) Patent No.: US 7,897,523 B2
(45) Date of Patent: Mar. 1, 2011

(54) SUBSTRATE HEATING APPARATUS, HEATING METHOD, AND SEMICONDUCTOR DEVICE MANUFACTURING METHOD

(75) Inventors: Masami Shibagaki, Fuchu (JP); Hiroshi Doi, Chofu (JP); Akihiro Egami, Kawasaki (JP); Toshiaki Sasaki, Tokorozawa (JP); Shinya Hasegawa, Fuchu (JP)

(73) Assignees: Canon Anelva Engineering Corporation, Kanagawa-ken (JP); Canon Anelva Corporation, Kanagawa-ken (JP)

( * ) Notice: Subject to any disclaimer, the term of this patent is extended or adjusted under 35 U.S.C. 154(b) by 244 days.

(21) Appl. No.: 12/360,378

(22) Filed: Jan. 27, 2009

(65) Prior Publication Data
US 2009/0191724 A1    Jul. 30, 2009

(30) Foreign Application Priority Data

Jan. 30, 2008    (JP) ............... 2008-019235
Jan. 19, 2009    (JP) ............... 2009-009352

(51) Int. Cl.
*H01L 21/311*    (2006.01)
*F27D 11/00*    (2006.01)

(52) U.S. Cl. .............. 438/795; 118/725; 219/438; 257/E21.328

(58) Field of Classification Search ............... 438/795, 438/796; 219/438; 257/E21.328; 118/725, 118/50.1

See application file for complete search history.

(56) References Cited

U.S. PATENT DOCUMENTS

| 6,692,574 | B1 * | 2/2004 | Tolt | 118/715 |
| 7,358,200 | B2 * | 4/2008 | Yoo | 438/795 |
| 7,645,342 | B2 * | 1/2010 | Emerson et al. | 118/725 |
| 2008/0078325 | A1 * | 4/2008 | Matsuda et al. | 118/723 HC |
| 2009/0321412 | A1 * | 12/2009 | Masaki et al. | 219/438 |

FOREIGN PATENT DOCUMENTS

| JP | 10-045474 | 2/1998 |
| JP | 2912613 | 4/1999 |
| JP | 2912616 | 4/1999 |
| JP | 2912913 | 4/1999 |

OTHER PUBLICATIONS

Shibagaki, M., et al., "Development of the Novel Bombardment Anneal System (EBAS) for SiC Post Ion Implantation Anneal," Materials Science Forum, vols. 483-485, p. 609-612 (2005).
Kimoto, T., et al., "Nitrogen Ion Implantation into α-SiC Epitaxial Layers," Phys. Stat. Sol., vol. 162, p. 263-276 (1997).

* cited by examiner

*Primary Examiner*—Tuan N. Quach
(74) *Attorney, Agent, or Firm*—Fitzpatrick, Cella, Harper & Scinto (57) ABSTRACT

A substrate heating apparatus having a conductive heater which heats a substrate includes a filament arranged in the conductive heater and connected to a filament power supply to generate thermoelectrons, and an acceleration power supply which accelerates the thermoelectrons between the filament and conductive heater. The filament has inner peripheral portions formed at a predetermined interval along an inner circle concentric with the substrate, outer peripheral portions formed at a predetermined interval on an outer circle concentric with the inner circle and having a diameter larger than that of the inner circle, and a region formed by connecting the end point of each inner peripheral portions and the end point of a corresponding one of the outer peripheral portions.

14 Claims, 7 Drawing Sheets

SUBSTRATE HEATING APPARATUS, HEATING METHOD, AND SEMICONDUCTOR DEVICE MANUFACTURING METHOD

BACKGROUND OF THE INVENTION

1. Field of the Invention

The present invention relates to a substrate heating apparatus which heats a substrate in a vacuum quickly, a heating method, and a semiconductor device manufacturing method employing the heating method.

2. Description of the Related Art

A semiconductor manufacturing technique frequently requires a process for heating and cooling a semiconductor substrate quickly. In particular, activation annealing of a wide bandgap semiconductor represented by silicon carbide (SiC) requires a high temperature of approximately 2,000° C.

An electron impact heating apparatus is conventionally proposed in which thermoelectrons are generated by a single-loop or multiple-coil filament arranged in a vessel placed in a vacuum, and are caused to collide to generate heat.

Figure 6:
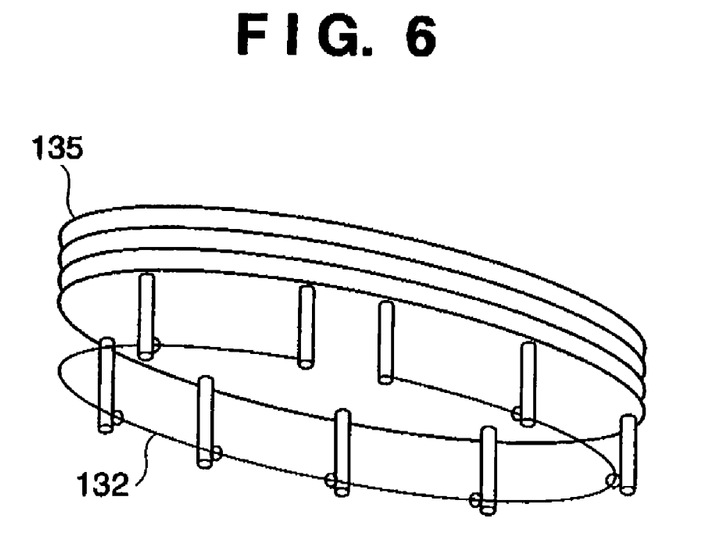
FIG. 6 is a perspective view showing the shape of a single-loop filament.
Figure 7:
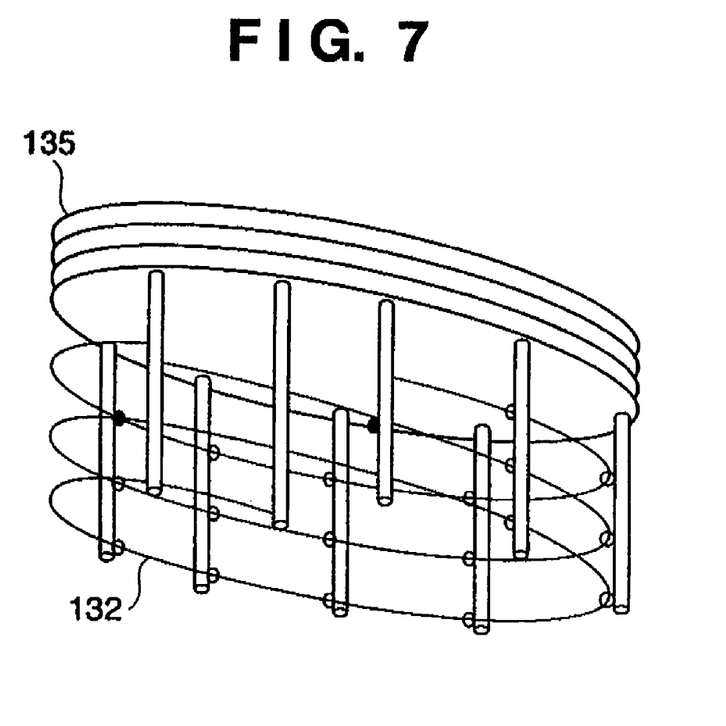
FIG. 7 is a perspective view showing the shape of a multiple-coil filament.

Usually, in the electron impact heating apparatus, the thermoelectrons are accelerated by applying an acceleration voltage between a filament and a conductive heater on which a substrate as an annealing target is arranged, thus generating a high temperature (Japanese Patent Nos. 2,912,613, 2,912,616, and 2,912,913). FIG. 6 is a perspective view showing the structure of a single-loop filament used in a conventional electron impact apparatus, and FIG. 7 is a perspective view showing the structure of a multiple-coil filament.

In the conventional electron impact apparatus, for example, a graphite vacuum heating vessel is proposed in which a tungsten filament has a single-loop or multiple-coil structure.

A triple-coil filament causes thermoelectrons to actively collide against a side surface of a conductive heater to increase the temperature of this surface. Utilizing heat conduction from the side surface of the conductive heater, a plate body such as a substrate arranged on the conductive heater is heated uniformly.

Thermoelectrons emitted from the filament do not have directivity when emitted from the filament, but are emitted in all directions about the filament as the center.

For this reason, the thermoelectrons are emitted not only in a direction to enter the side surface of the conductive heater which is to be desirably heated actively, but also toward the center of the filament and downward.

The thermoelectrons also emitted toward the center of the filament and downward are converged on the center portion of the conductive heater by a reflection plate provided under the filament, thereby, uniformity of heat is degraded in the conductive heater.

Figure 8:
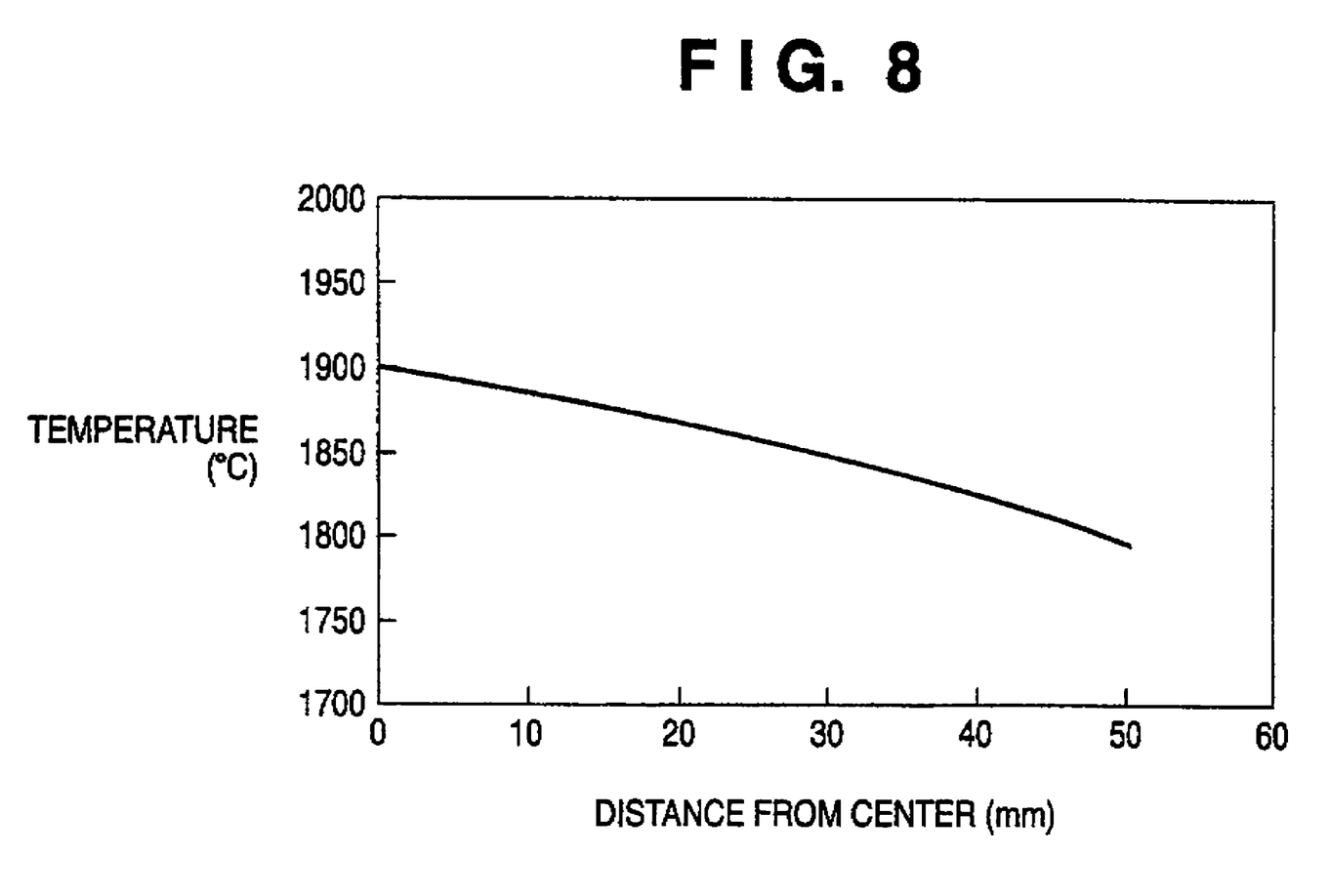
FIG. 8 is a graph showing the measurement result of a temperature distribution obtained by thermography using a multiple-coil heater.

FIG. 8 is a graph showing the result obtained by measuring the temperature distribution of a conductive heater by thermography when the filament is a multiple-coil heater. In FIG. 8, the axis of abscissa represents the distance (mm) from the center of the multiple-coil filament, and the axis of ordinate represents a temperature (° C.) corresponding to the distance.

In this manner, for example, in the conventional triple-coil filament, the thermoelectrons reflected by the reflection plate under the filament are undesirably focused on the center of the upper portion of the conductive heater because of the influence of the electric field. Consequently, the temperature difference at a location away from the center by 50 mm reaches near 100° C.

More specifically, in an apparatus in which electron impact heating is performed by a conventional coil filament, the temperature at the center of the conductive heater is extremely high. Also, heat radiation from the side portion of the heating surface of the conductive heater is large. Accordingly, uniform annealing characteristics within the substrate surface are not obtained.

Devices fabricated from a substrate which is heated in this manner vary largely in characteristics, leading to a low yield.

When a large-diameter substrate is heated, the electron impact amount at the center tends to further increase. This may increase the nonuniformity of the surface temperature distribution.

SUMMARY OF THE INVENTION

It is, therefore, an object of the present invention to provide an electron impact heating type substrate heating apparatus in which thermoelectrons are uniformly emitted toward the surface of a substrate to be annealed to improve a temperature distribution on the substrate under heating, a heating method, and a semiconductor device manufacturing method which employs this heating method.

According to one aspect of the present invention, there is provided a substrate heating apparatus including a conductive heater which is arranged to oppose a substrate held in a vessel in a reduced pressure and heats the substrate, comprising:

a filament arranged in the conductive heater and connected to a filament power supply to generate thermoelectrons; and an acceleration power supply which accelerates the thermoelectrons between the filament and the conductive heater, wherein the filament includes inner peripheral portions formed at a predetermined interval along an inner circle concentric with the substrate, outer peripheral portions formed at a predetermined interval on an outer circle concentric with the inner circle and having a diameter larger than that of the inner circle, and a region formed by connecting an end point of each of the inner peripheral portions and an end point of a corresponding one of the outer peripheral portions.

According to another aspect of the present invention, there is provided a substrate heating apparatus including a conductive heater which is arranged to oppose a substrate held in a vessel in a reduced pressure and heats the substrate, comprising:

a filament arranged in the conductive heater and connected to a filament power supply to generate thermoelectrons; and an acceleration power supply which accelerates the thermoelectrons between the filament and the conductive heater, wherein the filament is formed by connecting, of inner circle dividing points which divide at a predetermined interval a circumference of an inner circle concentric with the substrate and outer circle dividing points which divide at the predetermined interval a circumference of an outer circle concentric with the inner circle and having a diameter larger than that of the inner circle, a nearest one of the inner circle dividing points and a nearest one of the outer circle dividing points.

According to still another aspect of the present invention, there is provided a heating method comprising a heating step of heating the substrate using the substrate heating apparatus according to one aspect of the present invention.

According to yet another aspect of the present invention, there is provided a heating method comprising a heating step of heating the substrate using the substrate heating apparatus according to another aspect of the present invention.

According to still yet another aspect of the present invention, there is provided a semiconductor device manufacturing method of manufacturing a semiconductor device made of one of a single-crystal semiconductor and a compound semiconductor, comprising a heating step of heating the substrate using a heating method according to still another aspect of the present invention.

According to yet still another aspect of the present invention, there is provided a semiconductor device manufacturing method of manufacturing a semiconductor device made of one of a single-crystal semiconductor and a compound semiconductor, comprising a heating step of heating the substrate using a heating method according to yet another aspect of the present invention.

According to the present invention, in the electron impact heating type substrate heating apparatus, emission of thermoelectrons toward the surface of a substrate to be heated is improved, and the temperature distribution of the substrate under heating is improved.

Further features of the present invention will become apparent from the following description of exemplary embodiments with reference to the attached drawings.

DESCRIPTION OF THE EMBODIMENTS

Examples of preferred embodiments of the present invention will now be described in detail with reference to the accompanying drawings. Note that the constituent elements described in the embodiments are merely examples. The technical scope of the present invention is determined by the claims and not limited by the following individual embodiments.

First Embodiment

Figure 1:
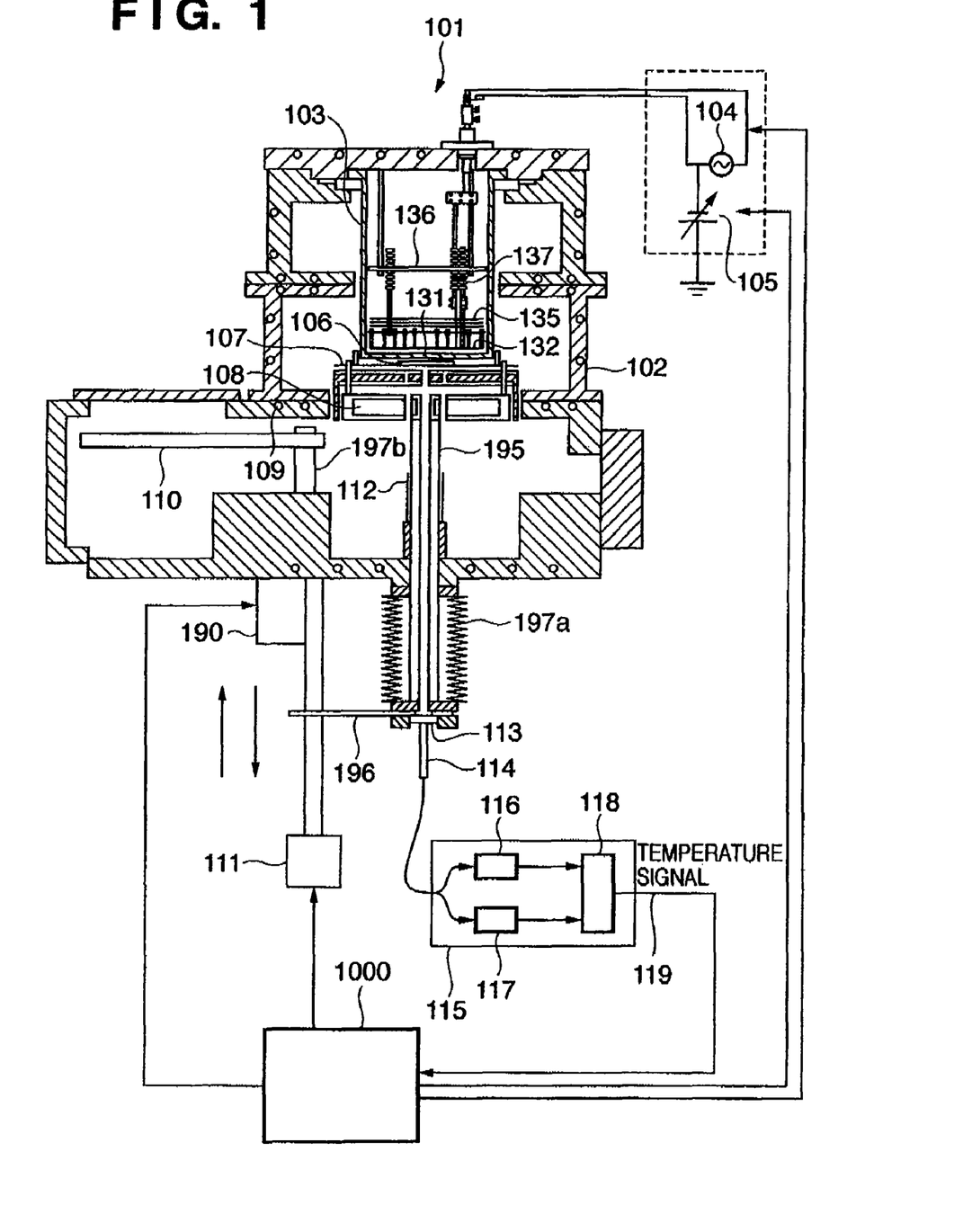
FIG. 1 is a sectional view showing a substrate heating apparatus according to the first embodiment of the present invention.

FIG. 1 is a sectional view showing a substrate heating apparatus according to the first embodiment of the present invention.

As shown in FIG. 1, a substrate heating apparatus 101 of this embodiment includes a vacuum chamber 102, vacuum heating vessel 103, filament power supply 104, high-voltage power supply 105, substrate 106, substrate stage 107, and substrate holding table 108. The substrate heating apparatus 101 also includes a conductive heater 131, water-cooling channel 109, water-cooling shutter 110, rotational drive mechanism 190, moving mechanism 111, controller 1000, and lift pins 112. The rotational drive mechanism 190 drives the water-cooling shutter 110. The moving mechanism 111 drives the substrate holding table 108. The controller 1000 controls the overall operation of the substrate heating apparatus 101. The substrate heating apparatus 101 also includes a two-wavelength-type radiation thermometer 115, wavelength detection element a 116, arithmetic circuit 118, wavelength detection element b 117, condensing portion 114, and transmission window 113. The arithmetic circuit 118 outputs a temperature signal 119. The substrate heating apparatus 101 also includes a filament 132, heat reflecting plates 135, insulation porcelain 137, and intermediate base plate 136. The controller 1000 can control the overall operation of the substrate heating apparatus 101 on the basis of at least one of the detection result output of the wavelength detection element a 116, the detection result output of the wavelength detection element b 117, and the calculation result of the arithmetic circuit 118.

The conductive heater 131 is arranged on an upper plate (a water-cooled lid) of the vacuum heating vessel 103. The moving mechanism 111 can move the substrate holding table 108 upward or downward. When the substrate holding table 108 is at the upper position, the substrate 106 held by the substrate stage 107 on the substrate holding table 108 opposes the conductive heater 131.

A turbo molecular pump (not shown) (with a stroke volume of 450 L/sec) can evacuate the vacuum chamber 102 on the order of $10^{-5}$ Pa.

The conductive heater 131 heats the substrate 106 which is held by the substrate holding table 108 in the vacuum chamber 102.

The conductive heater 131 is made of, for example, graphite, graphite coated with pyrolytic carbon, pyrolytic carbon, a heat-resistant ceramic material, or a heat-resistant metal.

The filament 132 made of tungsten or tungsten-rhenium is arranged in the conductive heater 131 coated with pyrolytic carbon.

The filament 132 is connected to the filament-heating AC power supply 104 through a current lead-in terminal. A potential difference is formed between the filament 132 and conductive heater 131. The filament 132 is also connected to the DC power supply 105 serving as an acceleration power source to accelerate thermoelectrons. The current lead-in terminal can isolate the vacuum from the atmosphere.

For example, the two-wavelength-type radiation thermometer 115 serving as a temperature measurement means is built under the substrate holding table 108. As the temperature measurement means, other than the radiation thermometer 115, for example, two-wavelength-type thermography can be used. Upon measurement of the temperature of the lower surface of the substrate stage 107 of the substrate holding table 108, the arithmetic circuit 118 outputs the temperature signal 119 which controls the current to be applied to the filament 132, so that the substrate stage 107 reaches a desired temperature. The filament-heating AC power supply 104 and the DC power supply 105 are controlled by the controller 1000 based on the temperature signal 119 output from the arithmetic circuit 118.

The substrate stage 107 according to this embodiment is made of, for example, pyrolytic carbon. When transporting the substrate 106 to be processed to the substrate stage 107, the controller 1000 controls the moving mechanism 111 to move the substrate holding table 108 downward. The controller 1000 then controls the rotational drive mechanism 190 to turn the water-cooling shutter 110. In FIG. 1, the water-cooling shutter 110 is in a retreat state. Upon driving of the rotational drive mechanism 190, when a rotating shaft 197b rotates, the water-cooling shutter 110 turns to insert the water-cooling shutter 110 as a heat insulation plate to a portion between the conductive heater 131 and substrate holding table 108. As a result, the conductive heater 131 and substrate holding table 108 are thermally isolated from each other.

The substrate holding table 108 and substrate stage 107 have holes which the lift pins 112 can pass through. When the substrate holding table 108 is at the lowermost portion, the distal ends of the lift pins 112 project from the substrate stage 107.

An arm (not shown) advances into the vacuum chamber 102 from a transport chamber (not shown) separated from the vacuum chamber 102 by a slit valve and evacuated to a vacuum. The arm places the substrate 106 on the lift pins 112 projecting from the substrate stage 107. The lift pins 112 include at least three lift pins 112 and support the substrate 106. After the arm is retreated from the vacuum chamber 102 to the transport chamber, the slit valve is closed. Through the above operation sequence, loading of the substrate 106 into the vacuum chamber 102 is completed.

A heating method (to be also merely referred to as a "processing method" hereinafter) for the substrate 106 using the substrate heating apparatus 101 will now be described. The processing method for the substrate 106 to be described below is performed under the overall control of the controller 1000. First, under the control of the controller 1000, the substrate holding table 108 moves upward, and the substrate stage 107 on the substrate holding table 108 lifts the substrate 106 from the lift pins 112. The substrate 106 is transferred from the lift pins 112 to the substrate stage 107. The controller 1000 moves the substrate holding table 108 further upward and positions it such that the distance between the conductive heater 131 and substrate 106 is, for example, 5 mm.

The substrate holding table 108 is connected to the moving mechanism 111 through a support column 195 and plate 196. The plate 196 and support column 195 are driven by the moving mechanism 111 to move upward or downward, thus moving the substrate holding table 108. The distance between the conductive heater 131 and substrate 106 can be adjusted arbitrarily by position control of the controller 1000.

The substrate heating apparatus 101 has a stretchable bellows member 197a. The bellows member 197a maintains the vacuum state in the vacuum chamber 102 by preventing the outer air from entering the vacuum chamber 102 through a sliding portion where the vacuum chamber 102 and support column 195 come into contact with each other when the plate 196 and support column 195 move upward or downward.

The wavelength detection element a 116 and wavelength detection element b 117 can measure the temperature of the substrate stage 107 in a noncontact manner through the support column 195, transmission window 113, and condensing portion 114.

After the substrate holding table 108 is positioned, for example, the AC current to the filament 132 is increased from 0 A to 25 A by 1 A/sec, and held at 25 A for 30 sec, thus preheating the filament 132.

After that, the DC power supply 105 increases the voltage flowing between the filament 132 and conductive heater 131 from 0 V to 1,500 V by approximately 50 V/sec, so that the filament 132 emits the thermoelectrons. Then, the emission current is gradually emitted. After the voltage is increased to approximately 1,500 V, the AC current is increased to approximately 29 A, and simultaneously the voltage of the DC power supply 105 is increased to approximately 2,500 V.

While monitoring the temperature of the substrate stage 107 by the two-wavelength-type radiation thermometer 115, the arithmetic circuit 118 controls the AC current value of the filament power supply 104 to increase it to 1,900° C. as a preset temperature in about 3 min. This heating is kept for about 1 min. After heating is kept for about 1 min, the filament power supply 104 and DC power supply 105 are turned off.

The temperature of the conductive heater 131 decreases quickly by radiation. When the temperature of the substrate stage 107 decreases to 1,200° C. (first detection temperature) in, for example, about 1 min, the substrate stage 107 moves downward. Away from the conductive heater 131 by 50 mm, the water-cooling shutter 110 serving as the heat insulation plate is inserted between the conductive heater 131 and substrate stage 107, to cool the substrate 106 quickly.

About 2 min later, when the temperature of the substrate stage 107 drops to, for example, 700° C. or less (second detection temperature), the substrate holding table 108 is moved further downward. The substrate 106 is transferred onto the lift pins 112, and the slit valve is opened.

The arm (not shown) advances into the vacuum chamber 102 from the transport chamber (not shown) separated from the vacuum chamber 102 by the slit valve and evacuated to a vacuum. The arm recovers the heated substrate 106 from the lift pins 112 and transports it to a load-lock chamber (not shown).

When the temperature of the heated substrate 106 drops to 150° C. or less (third detection temperature), the load-lock chamber (not shown) is vented to the atmosphere, and the substrate 106 is taken out from it.

In general, silicon carbide (SiC) is available in a plurality of crystal types, that is, 3C, 4H, and 6H. To perform homoepitaxial growth with uniform crystallinity, a silicon carbide (SiC) substrate in which the crystals are inclined by 4° or 8° with respect to the C-axis plane is used.

Other than this substrate, a substrate made of a single-crystal semiconductor such as silicon or a substrate made of a compound semiconductor such as gallium nitride can be used.

Figure 2:
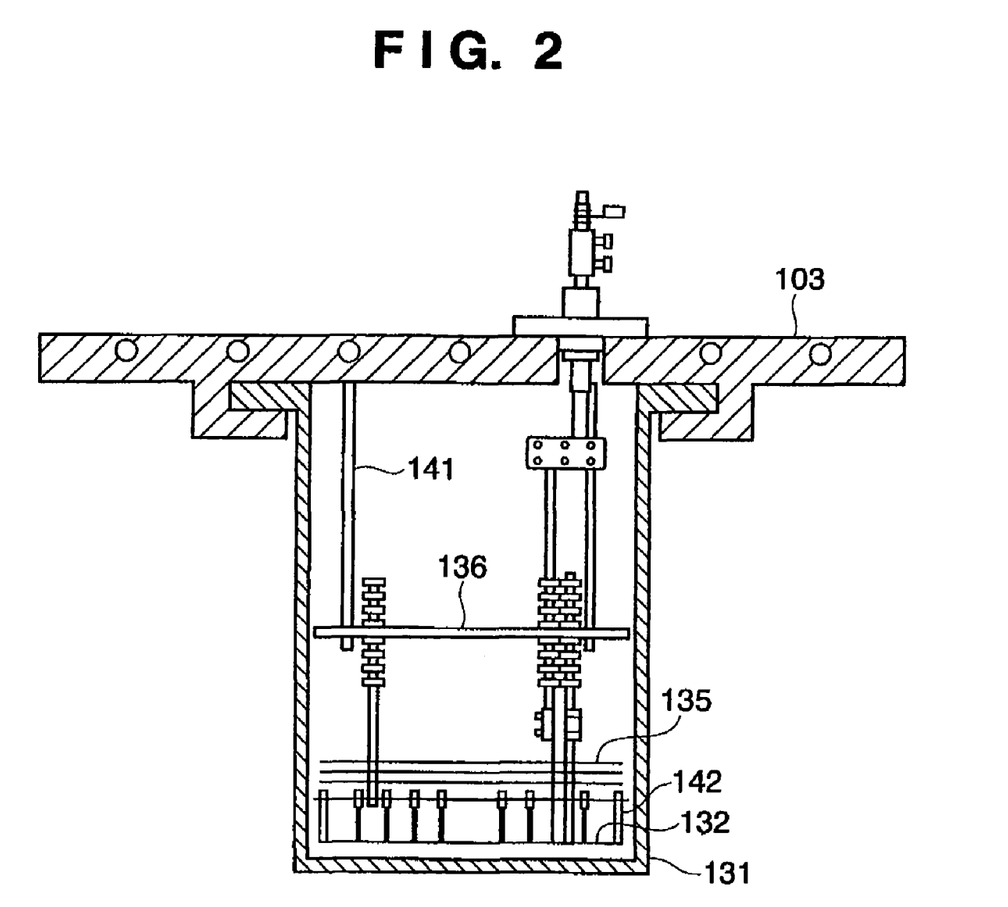
FIG. 2 is a sectional view showing a vacuum heating vessel in the substrate heating apparatus according to the first embodiment of the present invention.

FIG. 2 is an enlarged sectional view of the vacuum heating vessel 103 in the substrate heating apparatus according to the first embodiment of the present invention.

As shown in FIG. 2, the vacuum heating vessel 103 has a support column 141, the intermediate base plate 136, the reflecting plates 135, support columns 142, the filament 132, and the conductive heater 131.

According to this embodiment, the support column 141 and intermediate base plate 136 are made of molybdenum. The support columns 142 are made of tantalum. The filament 132 is made of tungsten-rhenium. The conductive heater 131 is made of graphite. The gist of the present invention is not limited to this example, and the vacuum heating vessel 103 can be formed of members having the same material properties as those of the above materials.

In the conductive heater 131 coated with pyrolytic carbon, the intermediate base plate 136 is fixed to the water-cooled lid of the vacuum heating vessel 103 of the substrate heating apparatus 101 by the four support columns 141.

The plurality of reflecting plates 135 are fixed to the intermediate base plate 136 through the support column 141. The filament 132 is fixed to the support columns (not shown).

Figure 3:
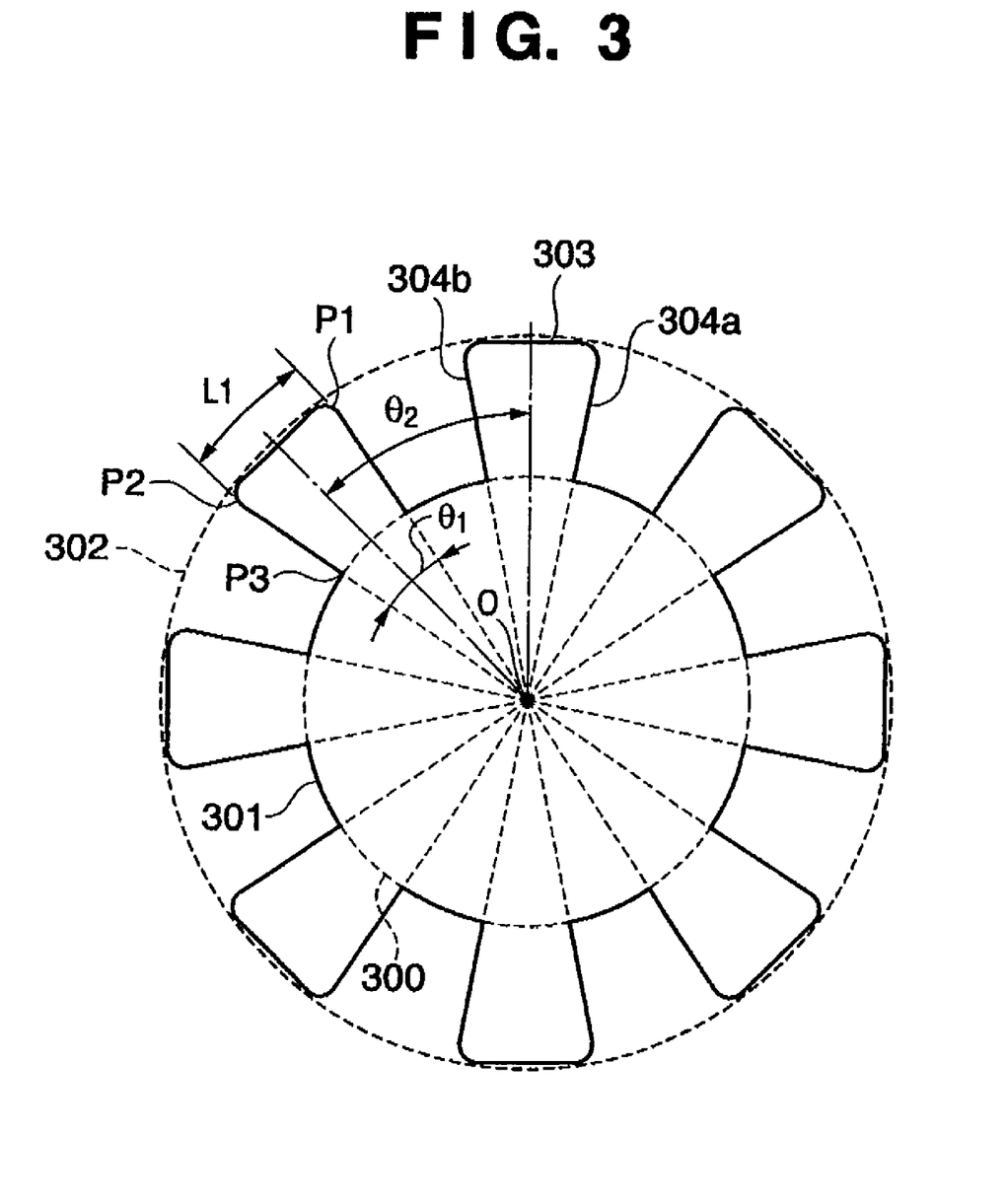
FIG. 3 is a plan view showing the shape of a filament in the substrate heating apparatus according to the first embodiment of the present invention.

FIG. 3 is a plan view showing the shape of the filament 132 in the substrate heating apparatus 101 according to the first embodiment of the present invention. Assume that the two ends (not shown) of the filament 132 are connected to the filament power supply 104.

As shown in FIG. 3, the intersection of the center axis of the substrate 106 and the center of the filament 132 is defined as a center O. The filament 132 has inner peripheral portions 301, outer peripheral portions 303, and radial portions 304a and 304b. The inner and outer peripheral portions 301 and 303 extend in the circumferential directions of concentric circles 300 and 302, respectively. The radial portions 304a and 304b extend between the concentric circles 300 and 302 in radial directions. The inner peripheral portions 301, radial portions 304a, outer peripheral portions 303, radial portions 304b, and inner peripheral portions 301 are connected in this order to form one filament 132.

More specifically, the filament 132 according to this embodiment has the inner peripheral portions 301 formed at a predetermined interval (e.g., a predetermined interval θ1) along the inner circle 300 having "O" as the center and concentric with the substrate 106. The filament 132 also has the outer peripheral portions 303 each formed by connecting two end points P1 and P2 arranged on the outer circle 302 at a predetermined interval (e.g., a predetermined interval L1 or θ2). The outer circle 302 is concentric with the inner circle 300 and has a diameter larger than that of the inner circumferential surface 300. Note that θ2 determines the angular interval of each outer peripheral portion 303, and L1 determines the positional interval of the end points of each outer peripheral portion 303. The filament 132 also has the radial portions 304a and 304b each formed by connecting the end point of the inner peripheral portion 301 and one end point of the corresponding outer peripheral portion 303. Of the two end points P1 and P2, one end point (e.g., the end point P2) is connected to the end point (an end point P3 in FIG. 3) of the nearest inner peripheral portion. This forms an arrangement corresponding to the radial portion 304b. The radial portions 304a and 304b and the outer peripheral portions 303 form regions extending from the inner peripheral portions 301.

According to this embodiment, a diameter d1 of the inner circle 300 (inner peripheral portions 301) and a diameter d2 of the outer circle 302 satisfy, for example, d1=90 mm and d2=150 mm, respectively. Note that the gist of the present invention is not limited to these numerical values. The same effect can be obtained by changing the diameters of the inner circle 300 and outer circle 302 with the same ratio in accordance with the size of the substrate 106 to be heated. Also, the number of concentric circles is not limited to two.

The filament 132 is connected to the tantalum-made current lead-in terminal. The reflecting plates 135 are set at the same potential as that of the filament 132 so that they efficiently reflect thermoelectrons emitted from the filament 132.

With the conventional triple-coil filament structure (e.g., FIG. 6), many electrons collide against the center portion of the heating surface of the conductive heater 131 which opposes the substrate 106. With the filament 132 of this embodiment, the electron impact amount at the side surface portion of the heating surface of the conductive heater 131 increases.

Figure 4:
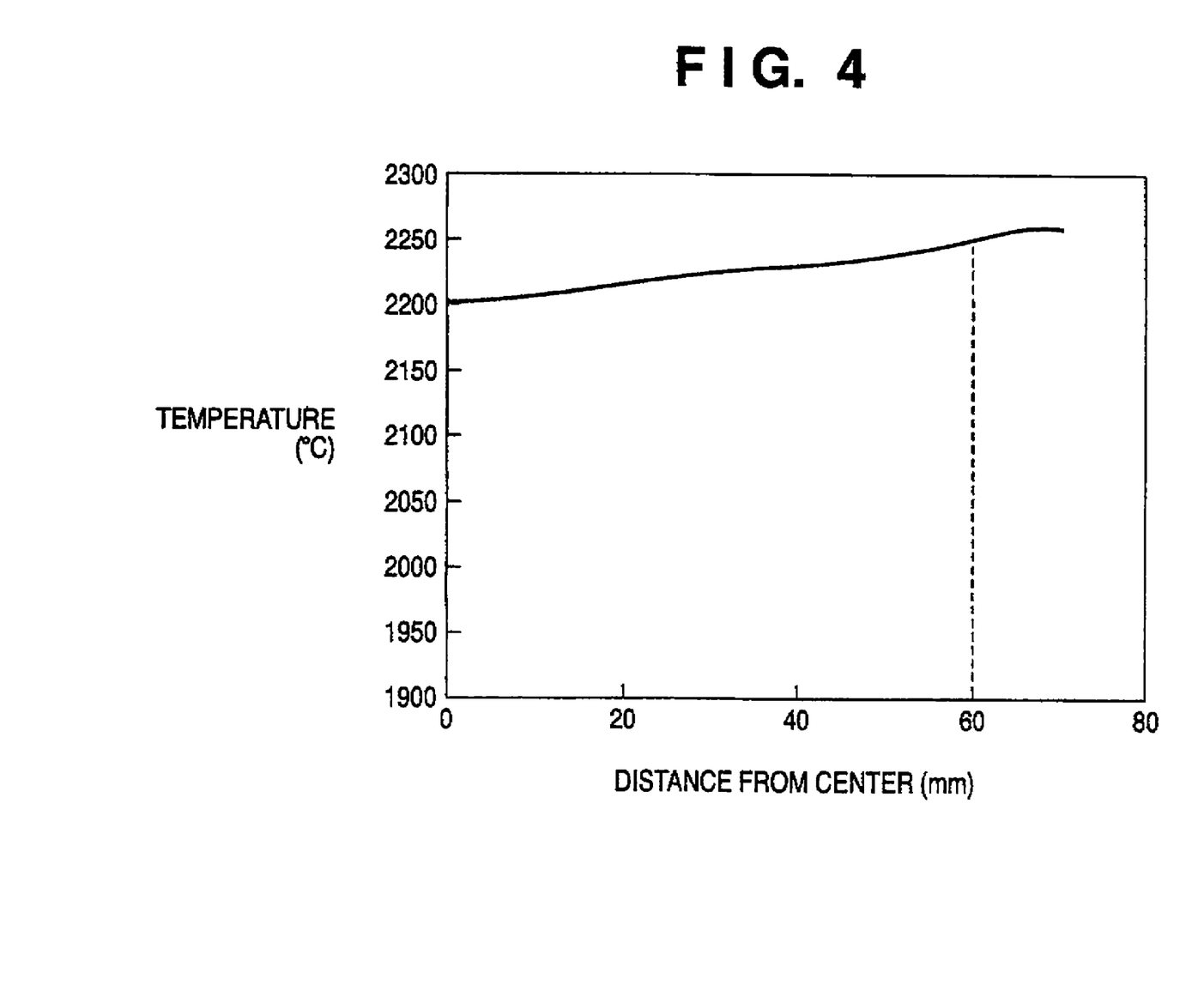
FIG. 4 is a graph showing a result obtained by simulating the temperature distribution of the surface of a conductive heater that employs the filament of the substrate heating apparatus according to the first embodiment of the present invention.

FIG. 4 is a graph showing a result obtained by simulating the temperature distribution of the surface of the conductive heater 131 that employs the filament 132 of the substrate heating apparatus 101 according to the first embodiment of the present invention. As the conductive heater 131, one having a diameter of 210 mm and coated with pyrolytic carbon is employed.

As shown in FIG. 4, a maximum temperature was exhibited at a distance of 70 mm from the center. The temperature difference between the center of the upper surface of the conductive heater 131 and the portion at the distance of 70 mm from the center of the upper surface of the conductive heater 131 was approximately +60° C. When compared with the case of a multiple-coil filament (which provides a temperature difference of 100° C. at a portion away from the center by 50 mm (see FIG. 8)), the temperature difference with respect to the center of the conductive heater was improved.

Figure 5A:
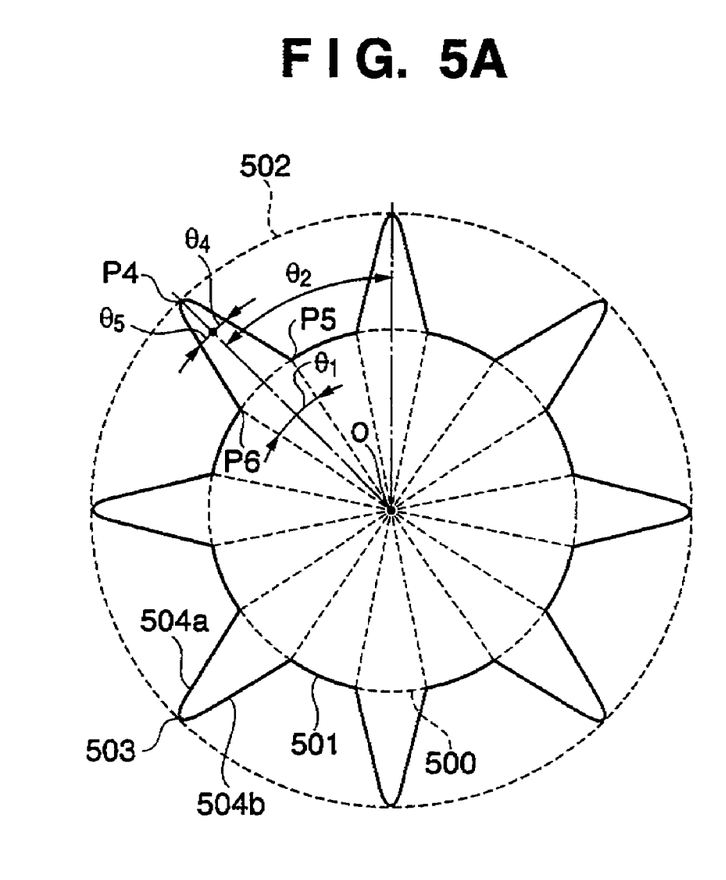
FIGS. 5A and 5B are views showing modifications of the filament shape.
Figure 5B:
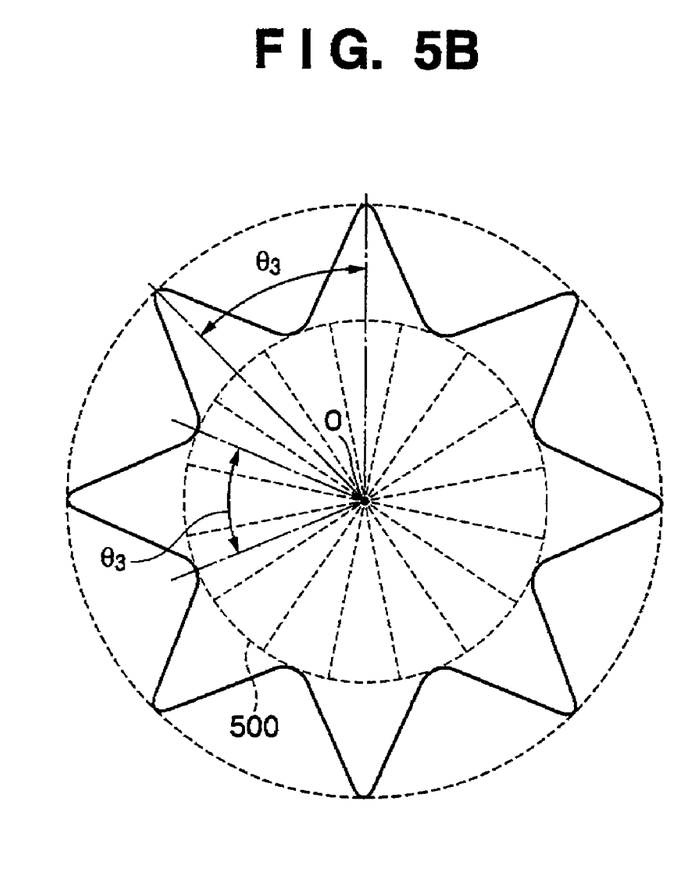

FIGS. 5A and 5B are views showing modifications of the filament 132.

Note that the two ends of the filament 132 are connected to the filament power supply 104. The intersection of the center axis of the substrate 106 and the center of the filament 132 is defined as the center O.

As shown in FIG. 5A, wiring lines of the filament 132 is formed on a plane parallel to the substrate 106 by combining directions to separate from the center O, directions to approach to the center O, and directions equidistant from the center O.

More specifically, the filament 132 has inner peripheral portions 501 formed at a predetermined interval (e.g., θ1) along an inner circle 500 having "O" as the center and concentric with the substrate 106. The filament 132 also has outer peripheral portions 503 each formed of one of end points P4 arranged on an outer circle 502 at a predetermined interval (e.g., θ2). The outer circle 502 is concentric with the inner circle 500 and has a diameter larger than that of the inner circle 500. The filament 132 also has regions 504a and 504b formed by connecting the end points of the inner peripheral portions 501 and the end points P4 of the outer peripheral portions 503. One end point P4 is connected to the end point of the nearest inner peripheral portion 501. For example, in FIG. 5A, when θ4=θ5, P5 and P6 are obtained as the end points of the nearest inner peripheral portion with respect to the end point P4. By connecting P4 to P5 and P6, the arrangement of that portion of the filament 132 which corresponds to the regions 504a and 504b described above can be obtained. The regions 504a and 504b and the outer peripheral portions 503 form regions extending from the inner peripheral portions 501.

FIG. 5B shows an example of wiring lines of the filament 132 formed by, of the directions to separate from the center O, the directions to approach the center O, and the directions equidistant from the center O shown in FIG. 5A, eliminating wiring lines which are equidistant from the intersection and combining the directions to separate from the intersection and the directions to approach to the intersection.

More specifically, the filament 132 is formed by connecting, of inner circle dividing points which divide at a predetermined interval (e.g., θ3) the circumference of the inner circle 500 having "O as the center and concentric with the substrate 106 and outer circle dividing points which divide at a predetermined interval (e.g., θ3) the circumference of the outer circle 502 concentric with the inner circle 500 and having a diameter larger than that of the inner circle 500, the nearest inner circle dividing point and the nearest outer circle dividing point.

In this embodiment, one filament 132 is employed. Alternatively, a plurality of filaments 132 having the same arrangement may be arranged to overlap with each other. Also, as shown in FIGS. 3, 5A, and 5B, filaments having different arrangements may be used to overlap with each other.

For example, filaments each having a shape as shown in FIG. 3 may be used such that the filament with a small diameter overlaps inside the filament with a large diameter such that the two filaments share the same center.

Regarding the sheet resistance of the implanted layer of a substrate processed using the filament of this embodiment, it was largely improved when compared to a case in which the substrate was processed with a multiple-coil filament. The yield of the semiconductor devices was also improved.

The present invention can be employed in a substrate heating apparatus and processing method for heating a substrate made of silicon carbide (SiC) or the like, and is suitable to the manufacture of a semiconductor device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-019235 filed Jan. 30, 2008, Japanese Patent Application No. 2009-009352 filed Jan. 19, 2009, which are hereby incorporated by reference herein in their entirety.

What is claimed is:

1. A substrate heating apparatus including a conductive heater which is arranged to oppose a substrate held in a vessel in a reduced pressure and heats the substrate, comprising:
   a filament arranged in the conductive heater and connected to a filament power supply to generate thermoelectrons; and
   an acceleration power supply which accelerates the thermoelectrons between the filament and the conductive heater,
   wherein the filament includes
   inner peripheral portions formed at a predetermined interval along an inner circle concentric with the substrate,
   outer peripheral portions formed at a predetermined interval on an outer circle concentric with the inner circle and having a diameter larger than that of the inner circle, and
   a region formed by connecting an end point of each of the inner peripheral portions and an end point of a corresponding one of the outer peripheral portions.

2. The apparatus according to claim 1, wherein
   each of the outer peripheral portions is formed by connecting two end points arranged at a predetermined interval on the outer circle, and
   one of the two end points is connected to an end point of a nearest one of the inner peripheral portions.

3. The apparatus according to claim 1, wherein
   each of the outer peripheral portions is formed of one of end points arranged at a predetermined interval on the outer circle, and
   the one end point is connected to an end point of a nearest one of the inner peripheral portions.

4. The apparatus according to claim 1, wherein two ends of the filament are connected to the filament power supply.

5. The apparatus according to claim 1, wherein the filament is formed by overlapping, in the conductive heater, a plurality of wiring lines having the same arrangement or a plurality of wiring lines having different arrangements.

6. The apparatus according to claim 1, wherein the substrate is made of one of a single-crystal semiconductor and a compound semiconductor.

7. A substrate heating apparatus including a conductive heater which is arranged to oppose a substrate held in a vessel in a reduced pressure and heats the substrate, comprising:
   a filament arranged in the conductive heater and connected to a filament power supply to generate thermoelectrons; and
   an acceleration power supply which accelerates the thermoelectrons between the filament and the conductive heater,
   wherein the filament is formed by connecting, of inner circle dividing points which divide at a predetermined interval a circumference of an inner circle concentric with the substrate and outer circle dividing points which divide at the predetermined interval a circumference of an outer circle concentric with the inner circle and having a diameter larger than that of the inner circle, a nearest one of the inner circle dividing points and a nearest one of the outer circle dividing points.

8. The apparatus according to claim 4, wherein two ends of the filament are connected to the filament power supply.

9. The apparatus according to claim 4, wherein the filament is formed by overlapping, in the conductive heater, a plurality of wiring lines having the same arrangement or a plurality of wiring lines having different arrangements.

10. The apparatus according to claim 4, wherein the substrate is made of one of a single-crystal semiconductor and a compound semiconductor.

11. A heating method comprising a heating step of heating the substrate using the substrate heating apparatus according to claim 1.

12. A semiconductor device manufacturing method of manufacturing a semiconductor device made of one of a single-crystal semiconductor and a compound semiconductor, comprising a heating step of heating the substrate using a heating method according to claim 11.

13. A heating method comprising a heating step of heating the substrate using the substrate heating apparatus according to claim 4.

14. A semiconductor device manufacturing method of manufacturing a semiconductor device made of one of a single-crystal semiconductor and a compound semiconductor, comprising a heating step of heating the substrate using a heating method according to claim 13.

* * * * *